United States Patent [19]
Terauchi

[11] Patent Number: 5,862,147
[45] Date of Patent: Jan. 19, 1999

[54] SEMICONDUCTOR DEVICE ON SEMICONDUCTOR WAFER HAVING SIMPLE WIRINGS FOR TEST AND CAPABLE OF BEING TESTED IN A SHORT TIME

[75] Inventor: Youji Terauchi, Tokyo, Japan

[73] Assignee: NEC Corporation, Tokyo, Japan

[21] Appl. No.: 845,236

[22] Filed: Apr. 21, 1997

[30] Foreign Application Priority Data

Apr. 22, 1996 [JP] Japan ..................................... 8-100039

[51] Int. Cl.$^6$ ....................................................... G06F 11/00
[52] U.S. Cl. ............................................................ 371/21.1
[58] Field of Search ................................. 371/21.1, 21.2, 371/22.1, 22.4, 22.5, 25.1; 324/73.1; 365/200

[56] References Cited

U.S. PATENT DOCUMENTS

| | | | |
|---|---|---|---|
| 5,648,275 | 7/1997 | Smayling et al. | 438/18 |
| 5,726,920 | 3/1998 | Chen et al. | 324/73.1 |

FOREIGN PATENT DOCUMENTS

| | | |
|---|---|---|
| 57-7136 | 1/1982 | Japan . |
| 58-502122 | 12/1983 | Japan . |
| 59-10230 | 1/1984 | Japan . |
| 60-192344 | 9/1985 | Japan . |
| 61-171137 | 7/1987 | Japan . |
| 62-171136 | 7/1987 | Japan . |
| 62-217625 | 9/1987 | Japan . |
| 62-283641 | 12/1987 | Japan . |
| 2-90549 | 3/1990 | Japan . |
| 2-202037 | 8/1990 | Japan . |
| 2-257650 | 10/1990 | Japan . |
| 3-159149 | 7/1991 | Japan . |
| 4-320044 | 11/1992 | Japan . |
| 4-322441 | 11/1992 | Japan . |
| 6-230031 | 8/1994 | Japan . |
| 6-230086 | 8/1994 | Japan . |

*Primary Examiner*—Vincent P. Canney
*Attorney, Agent, or Firm*—Whitham, Curtis & Whitham

[57] ABSTRACT

In a semiconductor device formed on a semiconductor wafer, writing unit writes a result signal into an unvolatile memory. A testing unit tests whether or not an execution unit of the semiconductor device executes a predetermined function correctly and produces the result signal. The result signal is used to diagnose the semiconductor devise itself. The execution unit may be included in the unvolatile memory.

20 Claims, 6 Drawing Sheets

SEMICONDUCTOR DEVICE ON SEMICONDUCTOR WAFER HAVING SIMPLE WIRINGS FOR TEST AND CAPABLE OF BEING TESTED IN A SHORT TIME

BACKGROUND OF THE INVENTION

This invention relates to a semiconductor device which is formed on a semiconductor wafer and relates to a method of testing whether or not the semiconductor device is acceptable. In particular, this invention relates to a semiconductor device which includes an unvolatile memory and relates to a method of testing whether or not the semiconductor device is acceptable.

In a semiconductor device manufacturing process, a plurality of semiconductor devices are formed on a semiconductor wafer in a lump. Subsequently, these semiconductor devices are individually tested whether or not each of semiconductor devices has a predetermined electric characteristic and whether or not executes a predetermined function correctly. Namely, each of the semiconductor devices is tested to ascertain quality. Afterwards, the semiconductor devices are cut away from semiconductor wafer into chips or pellets which have the semiconductor devices, respectively. At this time, the semiconductor devices are classified into acceptable group and nonacceptable group on the basis of results of the test, i.e. the quality. The semiconductor devices of the acceptable group are sent to a later process, for example, a packaging process, while the semiconductor devices of the nonacceptable devices are not send to the later process.

Some methods have been proposed to test the semiconductor devices. For example, there is a method which is described in Japanese Unexamined Patent Publication No. 322441/1992. In this method, the semiconductor devices tests themselves all at once in reply to a source voltage and a self-test starting signal. In this case, the source voltage and the self-test starting signal are supplied from a external tester through probes which are connected to the external tester and which are brought into contact with connecting pads connected to the semiconductor devices on the semiconductor wafer. Results of the test are transmitted to the external-tester through the probes and are memorized in a memory of the external tester.

Moreover, there is another method which is described in an Japanese Unexamined Patent Publication No. 283641/1987. In this method, the semiconductor devices test themselves at a time in reply to a source voltage. The source voltage is supplied to the semiconductor devices through a voltage supply line and a ground line both of which are wired formed on the semiconductor wafer and which are connected to the semiconductor devices. Each of the semiconductor devices is connected to an output terminal and supplies a result signal of the test through the output terminal. The result signal is gathered by the external tester. Similar methods are described in Japanese Unexamined Patent Publication No. 159149/1991, Nos. 320044/1992, and 257650/1990.

On the other hand, it is described in Japanese Unexamined Patent Publication No. 90549/1990 to give an unvolatile memory element to each of the semiconductor devices. The unvolatile memory element is used for memorizing a result obtained by testing each of the semiconductor devices. The result is written into the unvolatile memory element by the external tester to select acceptable devices before a package process. Similar technique is also disclosed in Japanese Unexamined Patent Publication No. 192344/1985.

In addition, it is further disclosed in an Japanese Unexamined Patent Publication No. 10230/1984 to connect a diode and a resistor to each of the semiconductor devices through a common wiring pattern for voltage supply. With this structure, a normal a voltage is kept even when a certain semiconductor device is shorted and much unusual electric current flows through the resistor. Therefore, the normal voltage is given to the other semiconductor devices than the shorted semiconductor device.

Other methods and other techniques for testing semiconductor devices one by one or two by two are disclosed in Japanese Unexamined Patent Publication Nos. 217625/1987, 230086/1994, 171136/1987, 7136/1982, and 171137/1987.

In any case, results of the test must be gathered one by one from the semiconductor devices by the external tester. Therefore, either complicated lines on the semiconductor wafer or many probes connected to the external tester are necessary to gather the results. Moreover, it takes a long time to carry out the test because the results must be gathered one by one as mentioned above.

SUMMARY OF THE INVENTION

It is an object of this invention to provide a semiconductor device which is formed on a semiconductor wafer and which is capable of being tested in a short time whether or not the semiconductor device is acceptable.

It is another object of this invention to provide a semiconductor device which is formed on a semiconductor wafer and which can make test lines simple.

Other objects of this invention will become clear as the description proceeds.

In order to understand the gist of this invention, it should be noted that a semiconductor device is formed on a semiconductor wafer and executes a predetermined function.

According to an aspect of this invention, a semiconductor device comprises an execution unit which executes the predetermined function. Testing means tests whether or not the execution unit executes the predetermined function and produces a result signal representative of a result of the test. Unvolatile memory means memorizes the result signal. Writing means writes the result signal into the unvolatile memory means to memorize the result signal in the unvolatile memory means.

According to another aspect of this invention, a semiconductor wafer has a plurality of device areas each of which is used for forming a semiconductor device. The semiconductor device executes a predetermined function. At least one of the device areas comprises an execution unit which executes the predetermined function. Testing means tests whether or not the execution unit executes the predetermined function correctly and produces a result signal representative of a result of the test. Unvolatile memory means memorizes the result signal. Writing means writes the result signal into the unvolatile memory means to memorize the result signal in the unvolatile memory means.

According to still another aspect of this invention, a testing instrument for use in supplying a source voltage from a external tester to a plurality of first connecting pads which is connected to semiconductor devices and which is formed on a semiconductor wafer together with the semiconductor device. The testing instrument comprises a plurality of first probes which is used for contacting with the first connecting pads and for supplying the source voltage to the first connecting pads. A plurality of first resistors are connected to the first probes to supply the source voltage from the external tester to each of the first probes.

DESCRIPTION OF THE PREFERRED EMBODIMENT

Figure 1:
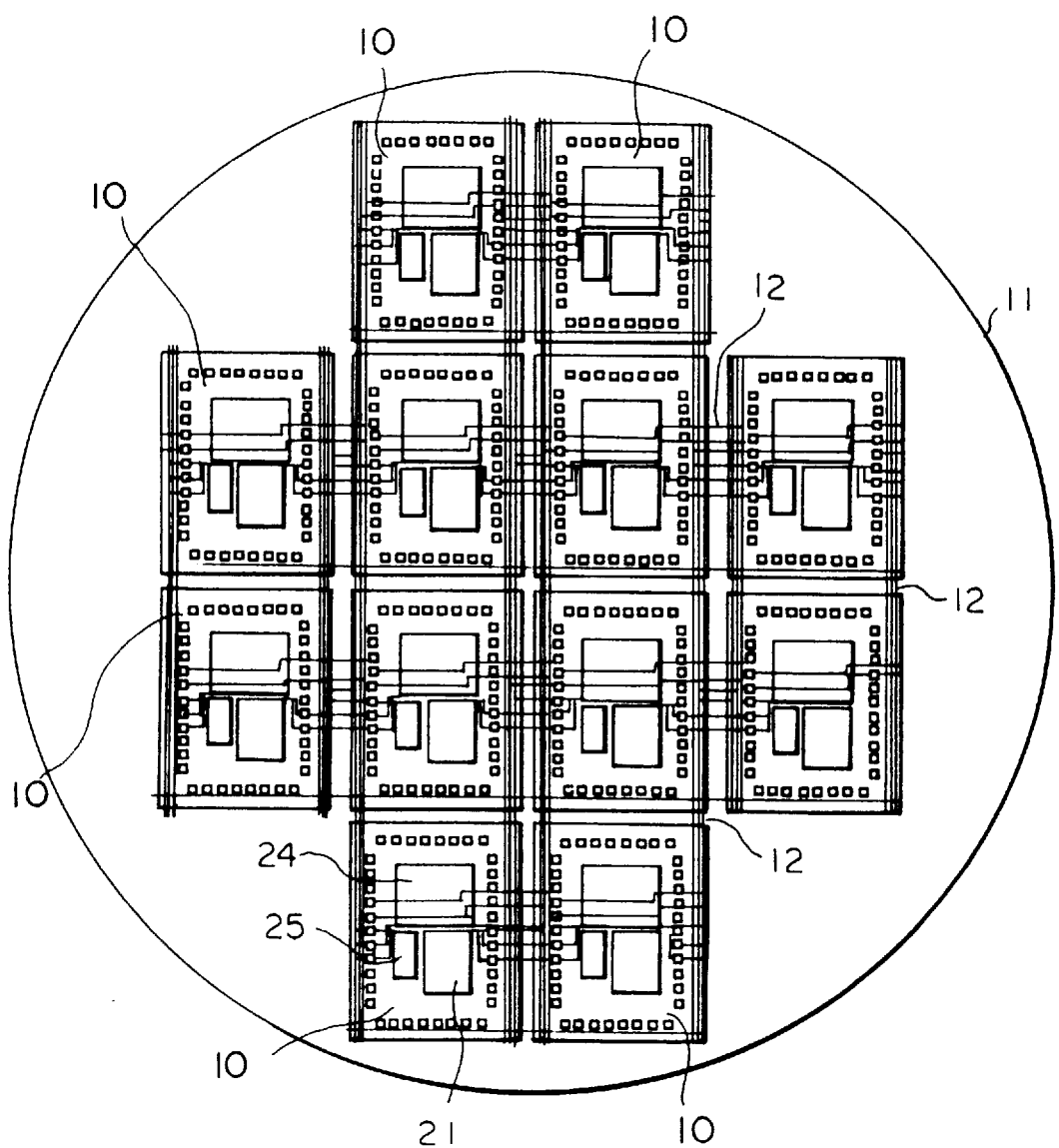
FIG. 1 shows a semiconductor wafer having semiconductor devices according to a preferable embodiment of this invention.
Figure 5:
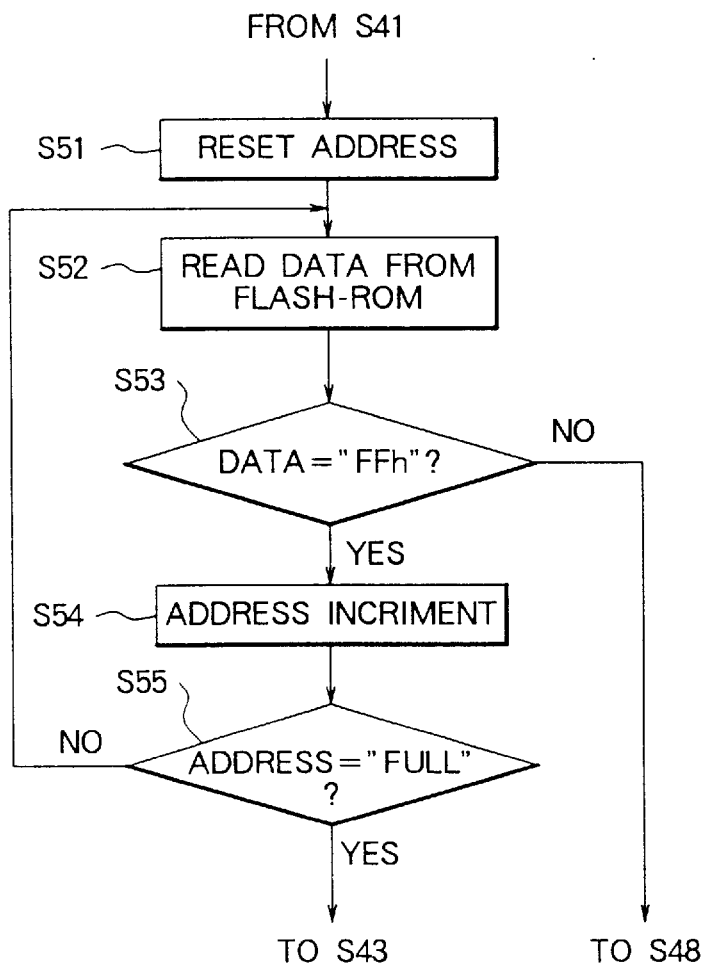
FIG. 5 is a flow chart for use in describing a step of 42 of FIG. 4.

Referring to FIGS. 1 and 5, description will be made about a semiconductor device according to a preferred embodiment of this invention.

In FIG. 1, a plurality of semiconductor devices 10 are formed in each pellet area on a semiconductor wafer 11. The semiconductor devices 10 are connected to one another by wirings or lines 12.

Figure 2:
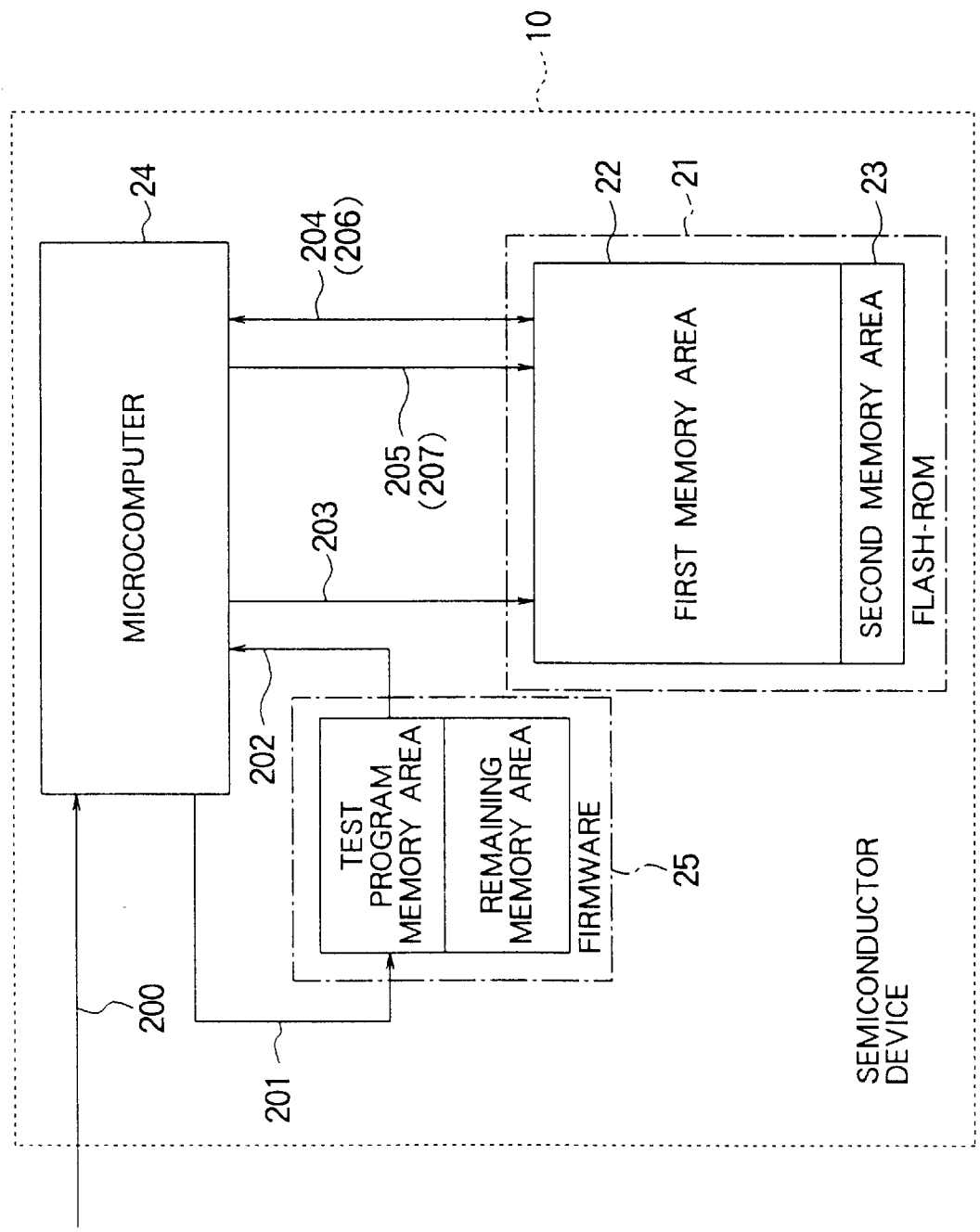
FIG. 2 is a block diagram of the semiconductor device of FIG. 1.

Referring to FIG. 2, each of the semiconductor devices 10 comprises a flash memory 21 which has a first memory area 22 programmable by user and a second memory area 23 programmable by a manufacturer. The second memory area 23 may be also used by a user after the semiconductor device 10 is manufactured by the manufacturer. A microcomputer 24 is connected to the flash memory 21 to test whether or not the flash memory 21 executes a predetermined function correctly. A firmware element (or ROM) 25 is connected to the microcomputer 24 and keeps a test program in a test program memory area. The test program is executed by the microcomputer 24 to test the flash memory 21.

Figure 3:
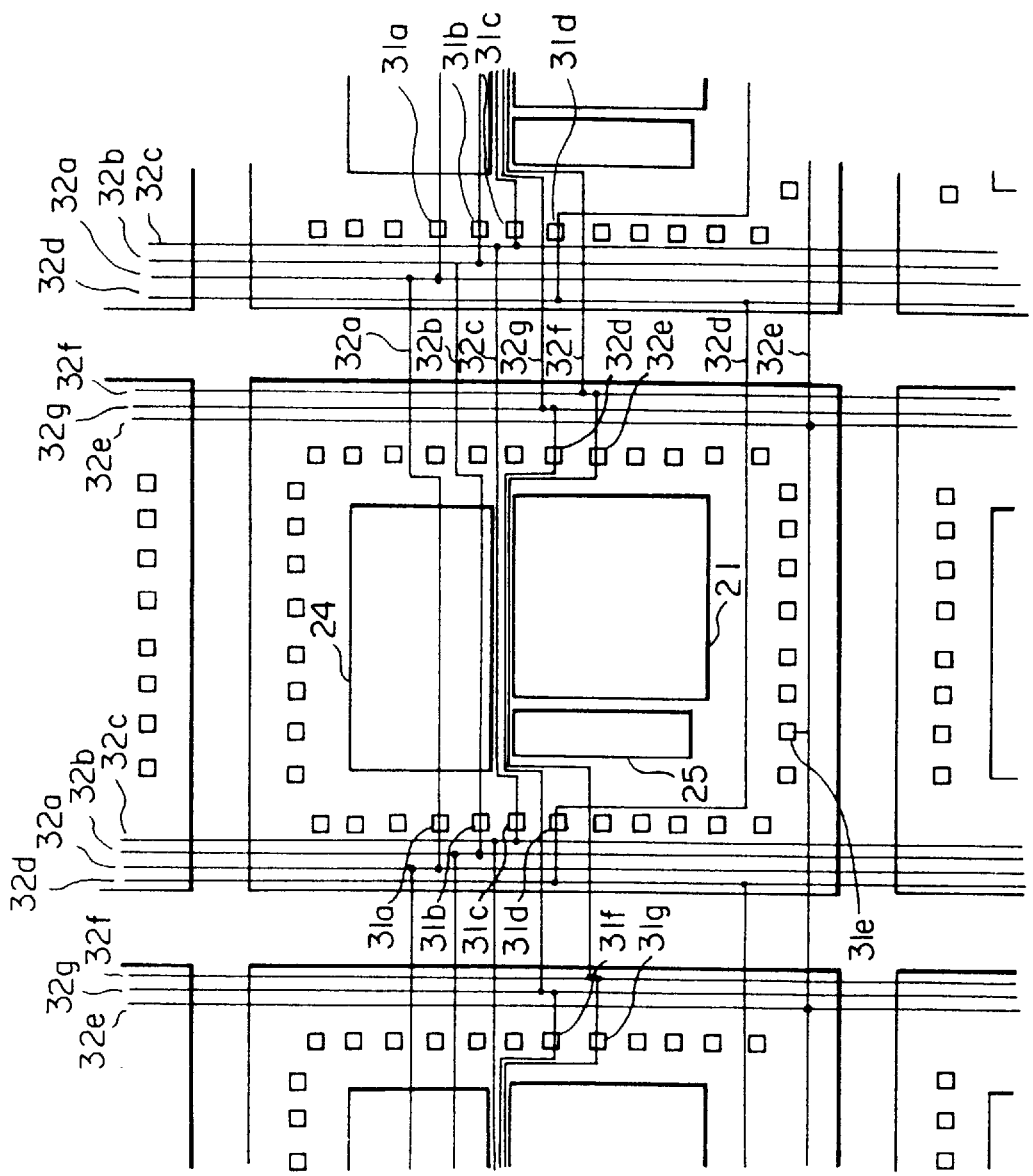
FIG. 3 shows wirings which is connected to pads of the semiconductor devices of FIG. 1.

Turning to FIG. 3, each of the semiconductor devices 10 further comprises a plurality of pads. The pads includes a first pad 31a for receiving a first source voltage, a second pad 31b for receiveing a first clock signal, a third pad 31c for receiving a second clock signal, a fourth pad 31d for receiving a ground voltage, a fifth pad 31e for receiving a reset signal, and a sixth pad 31f for receiveing a test control signal. These pads are connected to the microcomputer 24 by unillustrated wirings or lines. A seventh pad 31g is connected to the flash memory 21 by a conductive line (not shown) to be supplied with second source voltage. The pads 31a, 31b, 31c, 31d, 31e, 31f, and 31g are connected to lines or wirings 32a, 32b, 32c, 32d, 32e, 32f, and 32g through resistors (not shown), respectively. These wirings 32a–32g are connected in common to pads 31a–31g of any other semiconductor devices 10 formed on the semiconductor wafer 11 through similar resistors (not shown).

The first source voltage, the first clock signal, the second clock signal, the ground voltage, the reset signal, the test control signal, and the second source voltage are supplied from an external tester (not shown) to the wirings 32a, 32b, 32c, 32d, 32e, 32f, and 32g, respectively. As a result, the first clock signal, the second clock signal, the ground voltage, the reset signal, the test control signal, and the second source voltage are supplied at the same time to all of the semiconductor devices 10 on the semiconductor wafer 11. Each of the unillustrated resistors serves to a voltage of the wiring connected to the resistor even when a certain one of the semiconductor devices is shorted and unusual current-flows through the resistor.

It is noted here that a reduction of yield is liable to occur when resistors are arranged between the wirings and the semiconductor devices. Accordingly, the semiconductor devices must be carefully designed which include the resistors.

Figure 4:
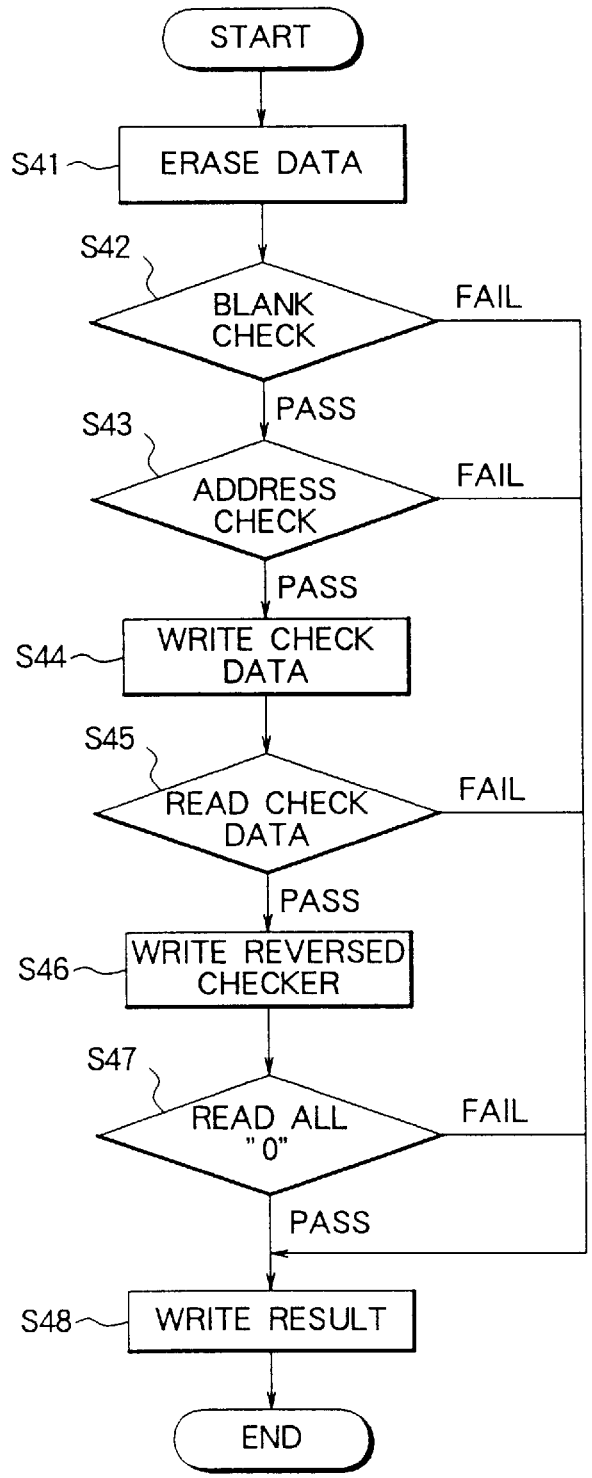
FIG. 4 is a flow chart for use in describing a method of testing whether or not the semiconductor device is acceptable.

Referring to FIGS. 2 with FIGS. 4 and 5, an operation of the semiconductor device 10 will be described below.

The microcomputer 24 is activated by an operational mode setting signal 200 which includes the first source voltage, the first clock signal, the second clock signal, the ground voltage, the reset signal, and the test control signal. The microcomputer 24 produces address signals 201 in response to the test control signal and reads out the test program 202 from the firmware 25 by the use of the address signals 201. Next, the microcomputer 24 executes the test program 202 to test the flash memory 21. Namely, the microcomputer 24 accesses the first memory area 22 of the flash memory 21 by the use of an area selecting signal 203 and writes into and reads out data 204 by the use of address signals 205. Then, the microcomputer 24 judges whether or not the flash memory 21 is acceptable on the basis of the data 204 and produces a result signal 206. Finally, the microcomputer 24 accesses the second memory area 23 of the flash memory 21 by the use of the area selecting signal 203 and writes the result signal 205 by the use of an address signal 207.

A specific example of testing the flash memory 21 will be explained soon with referring to FIG. 4 and 5.

First, the microcomputer 24 erases all data memorized in the flash memory 21 (step S41).

Second, the microcomputer 24 executes a blank check operation so as to check whether or not the flash memory 21 is in a normal initial state (step S42). Specifically, the blank check is carried out in a manner illustrated in FIG. 5. Namely, the microcomputer 24 resets an address register which is included in the microcomputer 24 (step SS1). Next, the microcomputer 24 reads out data memorized from an address "0" of the flash memory 21 (step S52) and checks whether or not the read out data are equal to a specific value, for example, "FFh" by the use of an ALU (arithmetical and logical unit) which is included in the microcomputer 24 (step S53). If the read out data are not equal to the specific value, the microcomputer 24 decides that the flash memory 24 fails in the blank check and the step S53 jumps to step S48. If the read out data are equal to the specific value, the microcomputer 24 decides that the flash memory 24 passes in the blank check and an address held in the address register is increased by "1" (step S54). At the following step 855, the microcomputer 24 judges whether or not the address held in the address register becomes a state of "FULL". If the address becomes a state of "FULL", the step S55 goes to step S43. If the address does not reach a state of "FULL", the step S55 returns to step S52.

Returning to FIG. 4, the microcomputer 24 executes an address check at the step S43 so as to check whether or not address decoders attached to the flash memory 21 is normally operated. When the flash memory 21 successfully passes the address check, the step S43 goes to step S44. When the flash memory 21 fails to pass the address check, the step S43 goes to the step S48.

After the flash memory 21 is allowed to pass the address check, the microcomputer 24 writes check data into the flash memory 21 (step S44). Then, the microcomputer 24 reads out the check data as a step S 45 and decides whether or not the check data are read out correctly. When the check data are read out correctly, the step S45 is followed by a step S46. This shows that the flash memory 21 is allowed to pass the checking operation executed as the step S45. To the contrary, when the check data are not read out correctly, namely, the flash memory 21 fails to pass the check of the step S45, the step S45 is succeeded by the step S48.

At the step S46 following the step S45, the microcomputer 24 writes reversed check data into the flash memory 21. Then, the microcomputer 24 reads out data memorized in the flash memory 21 (step S47). If the read out data are specified by all zeros, the microcomputer 24 decides that the flash memory 21 is allowed to pass the check of the step S47. If all of the read out data are not null, the flash memory 21 fails to pass the check of the step S47.

Finally, the microcomputer 24 writes results of the blank check, the address check, the check of the step S4S, and the check of the step S47 into the second memory area 23 of the flash memory 21.

In the later process, the results are read out from the flash memory 21 to diagnose the semiconductor device itself. Specifically, the semiconductor device 10 is classified into the acceptable group or the nonacceptable group on the basis of the results read out from the flash memory 21. The semiconductor device 10 which passes all of the checks belongs to the acceptable group while the semiconductor device 10 which fails to pass at least one of the checks belongs to the nonacceptable group.

As mentioned above, the results of the test are already written into the flash memory 11. Accordingly, it is unnecessary to gather the results by the use of the external tester. This means that it is unnecessary to arrange specific wirings or lines on the semiconductor wafer so as to collect or gather the results. Similarly, it is also unnecessary to form particular wirings and specific unvolatile memories on the semiconductor wafer to write and memorize the results. In addition, it is possible to decrease the number of probes which are to be connected to the external tester and which are used to be contacted with the pads of semiconductor devices. Moreover, a test time becomes short because the results are not gathered by the external tester. Besides, it is unnecessary that the external tester operates at a high speed because the external tester may not gather the results from all of the semiconductor devices formed on the semiconductor device.

As a rule, the above mentioned test is carried out before and after execution of an endurance test and may be divided into anterior and posterior tests in relation to the endurance test. It is be noted that during the endurance test, the semiconductor wafer is kept at a high temperature. Such a high temperature test may be made only about the semiconductor devices of the acceptable group which is allowed to pass the anterior test. Therefore, a test time of the posterior test is shorter than that of the anterior test.

In the posterior test, an access speed of the flash memory 21 is measured by the microcomputer 24. The access speed is written into the flash memory 21. The access speed is used for grading the flash memory 21 in the later process. Therefore, the later process is effectively carried out because the access speed memorized In the flash memory 21 can be used in the later.

While this invention has thus far been described in conjunction with a preferred embodiment thereof, it will be readily possible for those skilled in the art to put this invention into practice in various other manners. For example, the microcomputer 24 and the firmware 25 may be formed in another pellet area that is adjacent to the pellet area where the flash memory 21 is formed. In this case, the pellet areas may be disconnected from one another in a later process.

The second memory area 23 may be arranged in a specific unvolatile memory which is different from the flash memory 21 and which is formed in the pellet area together with the microcomputer 24 and the firmware 25. The specific unvolatile memory may be, for example, an EE-PROM or a flash memory.

Figure 6:
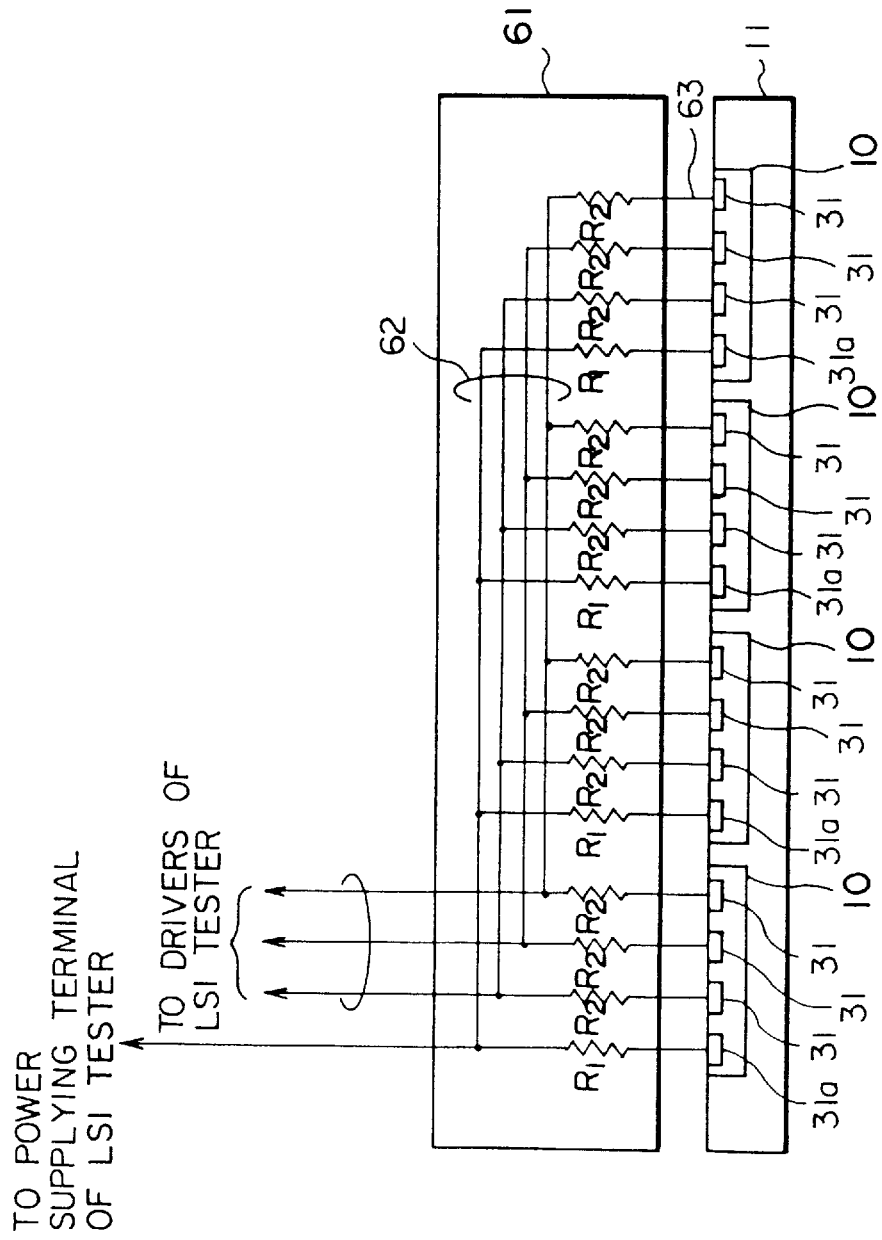
FIG. 6 shows a probe card according to a preferable embodiment of this invention.

The wirings 12 (32) may be replaced by a probe card as illustrated in FIG. 6. In FIG. 6, the probe card 61 has wirings 62, resisters R1 and R2, and probes 63. The wirings 62 corresponds to the wirings 12 of FIG. 2 and are connected to the external tester (LSI tester). The probes 62 are contacted with the pads 31 (four pads shown) of the semiconductor devices 10. The resistors RI are connected to the wiring 62 for supplying a source voltage and have each an about 5–100 ohms. The resistors R2 are connected to the wiring 62 for supplying other signals different from the source voltage and have each an about 5 k–500 k ohms. In this structure, the values of the resistors R1 and R2 can be easily changed from one to another. Moreover, the resistors R1 and R2 do not influence the yield because the resistors R1 and R2 are not formed on the semiconductor wafer 11. In addition, a surface area of the semiconductor wafer is used effectively and widely with this structure illustrated in FIG. 6.

What is claimed is:

1. A semiconductor device formed on a semiconductor wafer for executing a predetermined function, said semiconductor device comprising:

an execution unit for executing said predetermined function;

testing means for testing whether or not said execution unit executes said predetermined function correctly to produce a result signal representative of a result of the test;

unvolatile memory means for memorizing said result signal, and writing means for writing said result signal into said unvolatile memory means to memorize said result signal in said unvolatile memory means.

2. A semiconductor device as claimed in claim 1, wherein said execution unit is operable as an unvolatile memory device.

3. A semiconductor device as claimed in claim 2, wherein said unvolatile memory device cooperates with said unvolatile memory means.

4. A semiconductor device as claimed in claim 3, wherein said unvolatile memory device is an EE-PROM.

5. A semiconductor device as claimed in claim 3, wherein said unvolatile memory device is a FLASH-PROM.

6. A semiconductor device as claimed in claim 1, wherein said said writing means is included in testing means.

7. A semiconductor device as claimed in claim 6, wherein said testing means comprises:

a read only memory for memorizing a testing program to test said execution unit and to write said result signal into said unvolatile memory means; and a microcomputer for executing said testing program to produce said result signal and to memorize the result signal into said unvolatile memory means.

8. A semiconductor device as claimed in claim 1, said semiconductor device further comprising a connecting pad connected to said testing means for connecting said testing means with an external tester, wherein:

said connecting pad is connected to another connecting pad which is connected another testing means of an adjacent semiconductor device formed on said semiconductor wafer.

9. A semiconductor wafer having a plurality of device areas each of which is used for forming a semiconductor device executing a predetermined function, at least one of said device areas comprising:

an execution unit for executing said predetermined function;

testing means for testing whether or not said execution unit executes said predetermined function correctly to produce a result signal representative of a result of the test;

unvolatile memory means for memorizing said result signal; and writing means for writing said result signal into said unvolatile memory means to memorize said result signal in said unvolatile memory means.

10. A semiconductor wafer as claimed in claim 9, wherein said execution unit is operable as an unvolatile memory device.

11. A semiconductor wafer as claimed in claim 10, wherein said unvolatile memory device cooperates with said unvolatile memory means.

12. A semiconductor wafer as claimed in claim 11, wherein said unvolatile memory device is an EE-PROM.

13. A semiconductor wafer as claimed in claim 11, wherein said unvolatile memory device is a FLASH-PROM.

14. A semiconductor wafer as claimed in claim 9, wherein said writing means is included in said testing means.

15. A semiconductor wafer as claimed in claim 14, wherein said testing means comprises:

a read only memory for memorizing a testing program to test said execution unit and to write said result signal into said unvolatile memory means; and a microcomputer for executing said testing program to produce said result signal and to be memorized said result signal in said unvolatile memory means.

16. A semiconductor wafer as claimed In claim 9, said semiconductor device area further comprising a connecting pad connected to said testing means for connecting said testing means with an external tester, wherein:

said connecting pad is connected to another connecting pad which is connected to another testing means of an adjacent semiconductor device formed on said semiconductor wafer.

17. A testing instrument for use in supplying a source voltage from a external tester to a plurality of first connecting pads connected to semiconductor devices and formed on a semiconductor wafer together with said semiconductor devices, said testing instrument comprising;

a plurality of first probes for contacting with said first connecting pads to supply said source voltage to said first connecting pads; and a plurality of first resistors each of which is connected to each of said first probes to supply said source voltage from said external tester to each of said first probes.

18. A testing instrument as claimed In claim 17, said testing instrument further giving a ground voltage from said external tester to a plurality of second connecting pads connected to said semiconductor devices and formed on said semiconductor wafer together with said semiconductor devices, said testing instrument further comprising;

a plurality of second probes for contacting with said second connecting pads to supply said ground voltage to said second connecting pads; and a plurality of second resistors each of which is connected to each of said second probes for supplying said ground voltage from said external tester to each of said first probes.

19. A testing instrument as claimed in claim 17, said testing instrument further supplying test control signal from said external tester to a plurality of third connecting pads connected to said semiconductor devices and formed on said semiconductor wafer together with said semiconductor devices, said testing instrument further comprising;

a plurality of third probes for contacting with said third connecting pads to supply said test control signal to said third connecting pads; and a plurality of third resistors each of which is connected to each of said third probes for supplying said test control signal from said external tester to each of said third probes.

20. A method of testing a semiconductor device, said semiconductor device having testing means and unvolatile memory means, said method comprising the steps of:

supplying a source voltage to said testing means to drive said testing means;

testing whether or not the semiconductor device is acceptable to produce a result signal representative of a result of the test;

writing the result signal from said testing means into said unvolatile memory means to memorize the result signal in said unvolatile memory means; and reading the result signal out of the semiconductor device to diagnose the semiconductor device itself.

* * * * *